United States Patent
Gardner et al.

[19]

[11] Patent Number: 6,140,163
[45] Date of Patent: *Oct. 31, 2000

[54] METHOD AND APPARATUS FOR UPPER LEVEL SUBSTRATE ISOLATION INTEGRATED WITH BULK SILICON

[75] Inventors: Mark I. Gardner, Cedar Creek; Daniel Kadosh, Austin; Thomas E. Spikes, Jr., Round Rock, all of Tex.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/893,744

[22] Filed: Jul. 11, 1997

[51] Int. Cl.⁷ .......................... H01L 21/00; H01L 21/84; H01L 27/01; H01L 27/12

[52] U.S. Cl. .......................... 438/157; 438/479; 257/347; 257/500; 257/501

[58] Field of Search .................... 438/157, 197, 438/400, 478, 761, 763, 764, 787, 479; 257/288, 347, 365, 368, 500, 501, 506

[56] References Cited

U.S. PATENT DOCUMENTS

| | | | |
|---|---|---|---|
| 4,889,829 | 12/1989 | Kawai | 437/69 |
| 5,001,539 | 3/1991 | Inoue et al. | 357/41 |
| 5,083,190 | 1/1992 | Pfiester | 357/42 |
| 5,159,416 | 10/1992 | Kudoh | 357/23.7 |
| 5,266,507 | 11/1993 | Wu | 438/154 |
| 5,294,821 | 3/1994 | Iwamatsu | 257/351 |
| 5,338,965 | 8/1994 | Malhi | 257/492 |
| 5,373,170 | 12/1994 | Pfiester et al. | 257/69 |
| 5,399,507 | 3/1995 | Sun | 438/152 |
| 5,818,111 | 10/1998 | Jeng | 257/776 |
| 5,854,131 | 12/1998 | Dawson | 438/666 |
| 5,858,869 | 1/1999 | Chen | 438/597 |
| 6,034,399 | 3/2000 | Brady | 257/355 |

OTHER PUBLICATIONS

Wolf, "Silicon Processing for the VLSI Era," v.2, p. 66–79, 1990.

Primary Examiner—Charles Bowers
Assistant Examiner—Nema Berezny
Attorney, Agent, or Firm—Jenkens & Gilchrist

[57] ABSTRACT

A high performance semiconductor device structure and method of making the same include a bulk semiconductor substrate and an upper level silicon substrate. The upper level silicon substrate includes a low-K dielectric layer and a silicon substrate layer. The low-K dielectric layer is formed on the bulk semiconductor substrate, the low-K dielectric layer having a dielectric K-value in the range of 2.0–3.8. The silicon substrate layer and low-K dielectric layer are then patterned into the upper level substrate in a first region and the bulk semiconductor substrate is exposed in a second region. A gate oxide layer is formed over the upper level substrate in the first region and over the exposed bulk semiconductor substrate in the second region. Lastly, transistor device formations are formed in the upper level substrate and in the bulk semiconductor substrate.

20 Claims, 6 Drawing Sheets

METHOD AND APPARATUS FOR UPPER LEVEL SUBSTRATE ISOLATION INTEGRATED WITH BULK SILICON

BACKGROUND OF THE INVENTION

1. Field of the Invention

This invention relates generally to field effect transistor structures and, more particularly, to high performance MOSFET transistor structures and a method for making the same.

2. Discussion of the Related Art

A field-effect transistor (FET) is a solid state amplifying device. Amplification in the device occurs when the current through two terminals is varied by an electric field arising from voltage applied to a third terminal. The FET is thus a voltage controlled device. In an insulated-gate (IG) type of FET, the controlling field appears at an insulating layer. Variations in the field cause corresponding variations in the current through the device. Because the input or control voltage is applied across an insulator, the FET is further characterized by a high input impedance.

In the IGFET, the channel current is controlled by a voltage at a gate electrode which is isolated from the channel by an insulator. In one common configuration, an oxide layer is grown or deposited on the semiconductor surface, and a polysilicon gate electrode is deposited onto this oxide layer. The resulting structure is commonly called a metal-oxide-semiconductor (MOS) structure. If the device includes a source and drain, it represents a MOS transistor or MOSFET. The MOSFET has the advantage of extremely high input impedance between the gate and source electrodes, since these terminals are separated by an oxide layer. The general term IGFET includes devices in which the insulator may be some material other than an oxide layer.

In further discussion of the above, a MOSFET can be either a depletion device or an enhancement device. The depletion device MOSFET is one in which a channel exists at zero gate voltage. The depletion device is thus referred to as a normally on device. On the other hand, the enhancement device MOSFET is a device which requires a gate voltage to induce a channel and is further referred to as a normally off device. Furthermore, the MOSFET is either an n-channel or a p-channel device, depending upon the carrier type in the channel.

In an n-channel device, the source and drain regions include $n^+$ regions diffused into a high-resistivity p substrate. The channel region may be either a thin diffused n layer or an induced inversion region. In an n-type diffused channel device, the effect of the electric field is to raise or lower the conductance of the channel by either depleting or enhancing the electron density in the channel. When a positive voltage is applied to the gate (i.e., at the oxide-semiconductor interface), an electric field in the oxide layer exists between positive charge on the gate electrode and negative charge in the semiconductor. The negative charge is composed of an accumulation of mobile electrons into the channel and fixed ionized acceptor atoms in the depleted p material. If the gate-to-source voltage is positive, the conductivity of the channel is enhanced, while a negative gate voltage tends to deplete the channel of electrons. Thus a diffused-channel MOSFET can be operated in either the depletion or enhancement modes.

In an induced-channel MOSFET transistor, for an n-channel device, there is no diffused n-type region existing between source and drain at equilibrium. When a positive gate voltage is applied to the structure, a depletion region is formed in the p material, and a thin layer of mobile electrons is drawn from the source and drain into the channel. Where the mobile electrons dominate, the material is effectively n-type. This is called an inversion layer, since the material was originally p-type. Once the inversion layer is formed near the semiconductor surface, a conducting channel exists from the source to the drain. The operation of the device is then quite similar as discussed above. The channel conductance is controlled by the field in the insulator, but the magnitude of this field varies along the channel ($V_{GX}$) from the voltage at the drain ($V_{GS}$-$V_{DS}$) to the voltage at the source ($V_{GS}$). Since a positive voltage is required between the gate and each point x in the channel to maintain inversion, a large enough value of $V_{DS}$ can cause the field in the insulator to go to zero at the drain. As a result there is a small depleted region at the drain end of the channel through which electrons are injected in the saturation current. Once pinch-off is reached, the saturation current remains essentially constant. A p-channel MOSFET is similar to the n-channel, however, the conductivity types are reversed.

In addition, in the present state of the art, miniaturization of field-effect transistor device dimensions is continually being sought. Several limitations on miniaturization of FET devices have been encountered. For instance, it is extremely difficult to form FETs with the channel other than parallel to the substrate. Thus, the size of the transistor cannot generally be made smaller than the size of the gate or the channel. Furthermore, as the channel is made small, adverse effects on transistor performance occur. Modifications of existing techniques for fabrication of FET device structures introduce performance degradations into fabricated devices and limit performance characteristics of the same.

In the fabrication of very large scale integrated circuits (VLSI) and ultra large scale integrated circuits (ULSI), it would be desirable to improve upon device performance, in terms of, transistor speed, low power consumption, leakage current, as well as, provide a higher device density.

In prior known transistor structures, grown or deposited oxides have been known to be used for separating a polysilicon layer from an underlying substrate. A disadvantage of such oxides is that oxides have a relatively high dielectric constant or K-value. In particular, oxides have a dielectric constant in the range of 3.9–4.2. In addition, with respect to grown oxides, grown oxides are further undesirable in that they introduce encroachment issues such LOCOS bird's beak to a semiconductor structure.

Looking at a semiconductor memory device, U.S. Pat. No. 5,373,170, describes an SRAM cell with thin film transistors. The SRAM cell employs the use of grown oxides in the formation of thin film transistor devices. A transistor device is formed above a polysilicon layer which is above an active region of the substrate, including a source region, a channel region, and a drain region. The thin-film transistor of the '170 patent, however, suffers from not being built all in the same plane. As a result, the transistor of '170 requires extra space due to its non-planarity.

A depth of focus for a patterning exposure step in a semiconductor device fabrication process is an important consideration during a patterning step, especially for defining small device features, in the tenths of microns range. For instance, if during a patterning exposure, the topology of the substrate being exposed is substantially (and/or partially) outside of a depth of focus of an exposure apparatus, then it is difficult to accurately form the desired transistor devices. The fabrication process is thus degraded.

Fabrication of integrated circuit devices also involves numerous process steps which add to a cost of manufacturing the integrated circuit devices. It would thus be desirable to provide an improved method of making integrated circuit devices by reducing the number of process steps.

SUMMARY OF THE INVENTION

It is an object of the present invention to provide an integrated circuit structure and method of making the same which integrates high performance MOSFET transistor structures with bulk silicon MOSFET structures.

Another object of the present invention is to minimize adverse capacitive effects between high performance MOSFET transistor devices integrated with bulk silicon transistor devices.

Still further, an object of the present invention is to provide a method of fabricating high performance MOSFET devices integrated with the fabrication of bulk silicon devices in a single integrated process flow.

According to the present invention, a method of making a high performance semiconductor device structure includes providing a bulk semiconductor substrate and an upper level silicon substrate. The upper level silicon substrate includes a low-K dielectric layer formed on the bulk semiconductor substrate, the low-K dielectric layer having a dielectric K-value in the range of 2.0–3.8. The upper level substrate further includes a silicon substrate layer formed upon the low-K dielectric layer. The silicon substrate layer and low-K dielectric layer are patterned into the upper level substrate in a first region and the bulk semiconductor substrate is exposed in a second region. A gate oxide layer is formed over the upper level substrate in the first region and over the exposed bulk semiconductor substrate in the second region. Lastly, transistor device formations are formed in the upper level substrate and in the bulk semiconductor substrate.

In addition, according to the present invention, a high performance semiconductor device structure includes a bulk semiconductor substrate and an upper level silicon substrate. The upper level silicon substrate includes a low-K dielectric layer and a silicon substrate layer. The low-K dielectric layer is formed on the bulk semiconductor substrate, the low-K dielectric layer having a dielectric K-value in the range of 2.0–3.8. The silicon substrate layer and low-K dielectric layer are then patterned into the upper level substrate in a first region and the bulk semiconductor substrate is exposed in a second region. A gate oxide layer is formed over the upper level substrate in the first region and over the exposed bulk semiconductor substrate in the second region. Lastly, transistor device formations are formed in the upper level substrate and in the bulk semiconductor substrate.

BRIEF DESCRIPTION OF THE DRAWINGS

The foregoing and other teachings and advantages of the present invention will become more apparent upon a detailed desription of the best mode for carrying out the invention as rendered below. In the description to follow, reference will be made to the accompanying drawings, where like reference numerals are used to identify like parts in the various views and in which.

DETAILED DESCRIPTION OF A PREFERRED EMBODIMENT OF THE INVENTION

In accordance with one aspect of the present invention, the present invention excludes the use of a grown oxide in the formation of an upper level substrate, thus it does not suffer from encroachment issues which arise from the use of such grown oxides. The present invention advantageously utilizes a low-K dielectric material for separating a deposited polysilicon upper level substrate from an underlying bulk silicon. High performance MOSFET devices are formed as may be required for a particular IC application using the upper level polysilicon substrate, to be discussed further herein below.

The present invention also advantageously enables a speed of an integrated circuit to be increased as a result of an increase in speed in high performance MOS transistor devices formed in the upper level polysilicon substrate in accordance with the present invention.

Referring now to FIGS. 1–6, the present invention utilizes a combination of a bulk substrate 10 and an overlying low-K dielectric layer 12, the overlying low-K dielectric layer being used to define an upper level substrate as discussed herein below. A polysilicon layer 14 is used for providing the upper level substrate. Note that, in accordance with the present invention, a substrate definition is maintained in the upper level substrate subsequent to the formation of high performance MOS transistor devices in the upper level substrate. Maintaining of an upper level substrate definition refers to having some of an underlying conductivity type upper level substrate remaining after the formation of the high performance devices in the upper level substrate. For example, if the upper level substrate is doped p-type and NMOS high performance transistor devices are formed in the upper level substrate, then the upper level substrate will still retain a portion of the p-type substrate underneath the NMOS devices after formation of the NMOS devices. This is in contrast to consumption of a polysilicon layer formed upon an oxide layer, wherein the entire polysilicon layer is consumed during a device formation therein. The upper level substrate is thus utilized for fabricating high performance MOS transistor devices, to be further discussed herein below.

Figure 1:
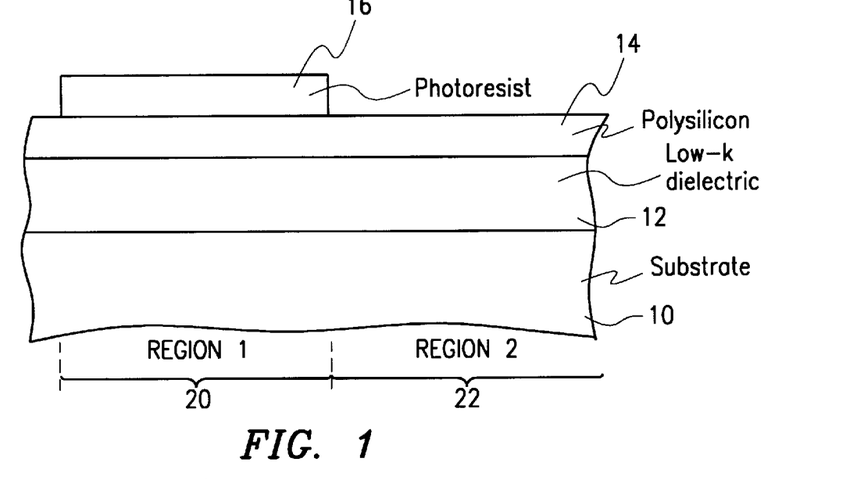
FIGS. 1–6 illustrate various process flow steps in the method of making an integrated high performance MOSFET and bulk silicon device structure according to the present invention.

The method of making high performance MOSFET devices in an upper level substrate integrated with bulk silicon substrate devices begins by providing a bulk silicon substrate or wafer 10 (FIG. 1). Substrate 10 has a typical thickness on the order of 725 $\mu$m and is generally very planar. A low-K dielectric layer 12 is then formed upon the substrate 10, wherein a very planar low-K dielectric layer is formed. That is, the low-K dielectric layer 12 is highly planar since it is preferably a first layer deposited upon an already planar substrate. The low-K dielectric layer 12 has a relative thickness in the range on the order of 1,000 to 3,000 Å.

Low-K dielectric materials, having a dielectric constant between 1–3.8, provide a number of unique benefits to the present invention. Air has a dielectric constant or K-value of 1. The low-K dielectric material layer of the semiconductor IC device structure according to the present invention is preferably a deposited layer. The low-K dielectric material layer is also preferably formed with some type of fluorine incorporation, such as $SiF_4$, as one possibility for example. Alternatively, the low-K dielectric material may include spin-on type materials, such as spin-on glass having a fluorine incorporation.

As discussed above, the low-K materials preferably include deposition type and/or spin-on type materials having a fluorine component. With respect to the low-K materials, fluorine is introduced into a standard dielectric deposition process or a standard spin-on process. Formation of a standard spin-on glass layer is well known in the art. For example, with a standard oxide deposition process, an overall addition of fluorine into the oxide will significantly lower the dielectric K value thereof, for example, in the range of 3.0 to 3.8. The low-K material may further include plastic type polymers, which have an even lower K value in the range of 2.0 to 3.5. Furthermore, any dielectric material with fluorine is caustic to metal line widths, whereas non-fluorine incorporated dielectric materials are non-caustic to metal line widths. Suitable protective coatings are thus provided as necessary if metal line widths are present on the integrated circuit during formation of the low-K dielectric material. Examples of low-K fluorine incorporated dielectric materials include for example, fluorosilicate glass (FSG), silicon oxyfluoride (FxSiOy), hydrogen silsesquioxane, fluorinated polysilicon, poly-phenylquinoxaline, polyquinoline, methysilsesquixane polymer, and fluoropolymide.

The low-K dielectric material of the semiconductor IC device structure according to the present invention may be made by replacing silane ($SiH_4$) with $SiF_4$ in a standard film deposition, which results in the production of a low-K F type film (which is caustic) in a deposition plasma reaction. The low-K material may also be formed by any deposition from a fluorine containing ambient (i.e., F-containing ambient) such that a fluorine concentration in the range of 3–20 atom percent is achieved. With F-based films, a K value in the range of 3.0–3.8 is achievable, either from a deposition type formation or a spin-on type formation. Plastic type polymers provide a lower K value in the range of 2.0–3.5.

The present invention thus includes a low-K dielectric layer 12 formed upon a bulk substrate 10. A polysilicon layer 14 is then deposited upon the low-K dielectric layer 12 using any suitable known deposition technique. Polysilicon layer 14 has a thickness on the order of 500 to 1,000 Å. The combined thicknesses of the low-K dielectric layer 12 and polysilicon layer 14 is in the range on the order of 2,000 to 4,000 Å. The polysilicon layer 14 and the low-K dielectric layer 12 are then patterned with a photoresist 16 and etched as needed in order to form a desired upper level substrate 18. See FIGS. 1 and 2. Patterning and etching with a photoresist is known in the art. The upper level substrate 18 is used in the manufacture of high performance MOSFET devices, to be discussed further herein below. The desired upper level substrate 18 overlies a first region 20 of the bulk substrate covered thereby. An area outside of the first region 20 is referred to herein as a second region 22. The second region 22 of the bulk substrate 10 is used for the fabrication of bulk silicon devices, such as, bulk silicon transistor devices. The upper level substrate 18 thus provides an additional plane upon which to fabricate high performance MOSFET devices, in close proximity to bulk silicon devices.

Figure 4:
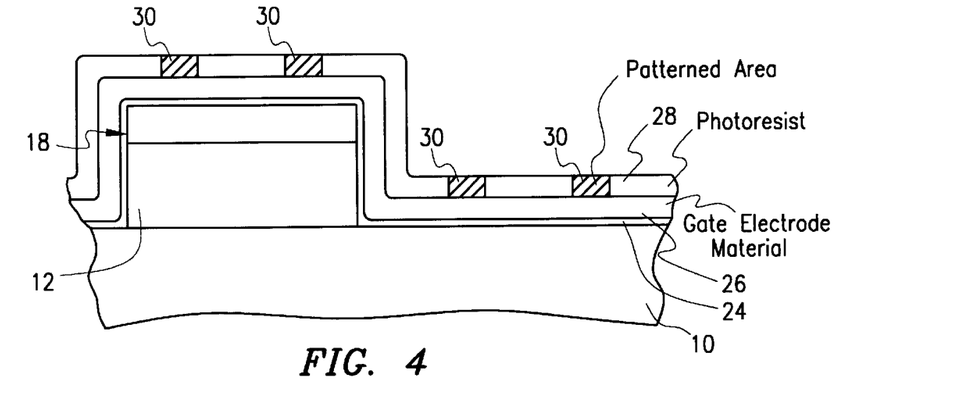
Figure 5:
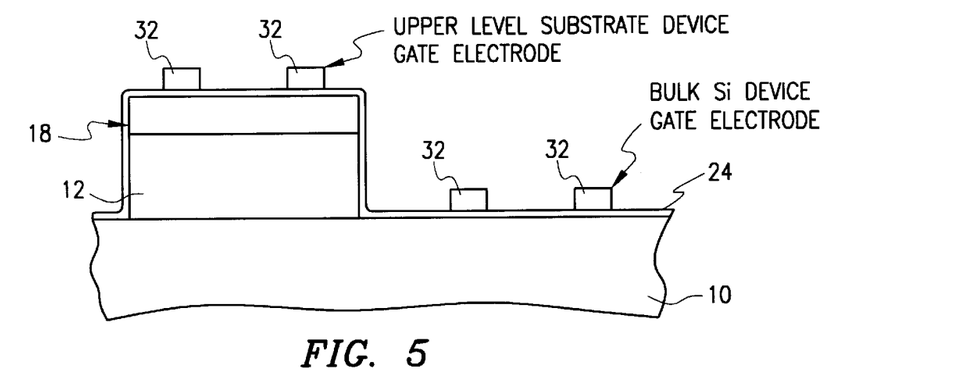

The upper level substrate 18 thus includes a silicon material, preferably, polysilicon. A gate oxide 24 (FIG. 3) is formed over the upper level polysilicon substrate 18, followed by the formation, patterning and etching of a conductive material or conductor 26 upon the gate oxide 24 (FIGS. 4 and 5). In the first embodiment, gate oxide 24 has a relative thickness in a range on the order of 10–40 Å. Conductive material 26 for use in forming desired gate electrodes has a thickness in the range on the order of 500 to 2,000 Å. Patterning and etching of conductor 26 is accomplished using a suitable photoresist 28, including patterned exposed areas 30. The patterned and etched gate conductor 26 provide gate electrodes 32 upon the gate oxide 24. The gate conductor 26 may include any suitable metal or polysilicon. Exemplary metals include aluminum (Al), tungsten (W), titanium (Ti), and cobalt (Co). The polysilicon may include doped N+ or P+ doped polysilicon, depending upon a particular desired transistor application. In the embodiment as shown in FIG. 5, gate electrodes 32 are formed in REGION 1 (20) and REGION 2 (22), further as noted in FIG. 6.

Figure 6:
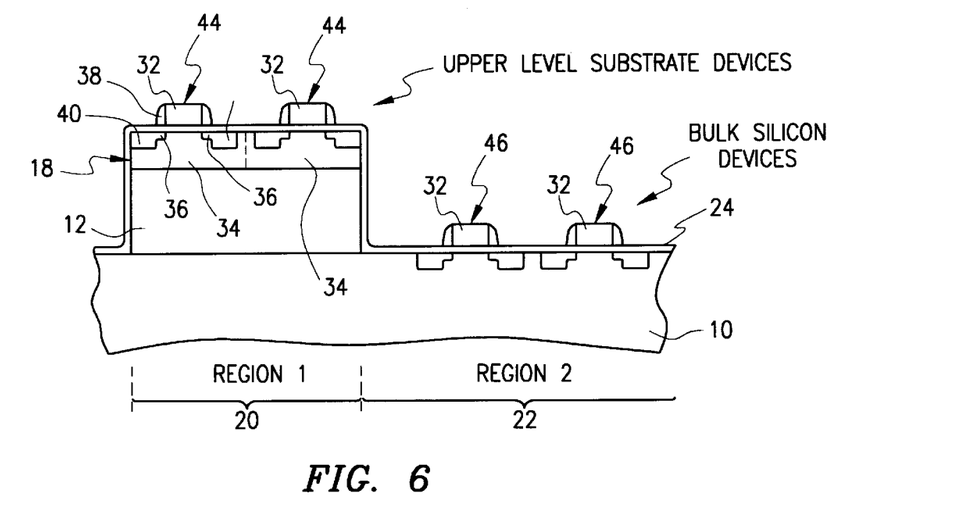

Turning now to FIG. 6, the present invention further includes the fabricating of high performance MOSFET transistor devices having small foot prints and requiring a minimum of space. In accordance with the present invention, high performance MOSFET transistors are formed in the upper level substrate 18. As discussed, the upper level polysilicon substrate 18 of the high performance transistor devices is deposited upon a low-K dielectric layer 12. A key feature of the present invention is that the high performance MOSFET transistor structure(s) formed in the upper level substrate 18 are mostly planar as well. This is an important consideration, for example, especially in the manufacture of small geometries on the order of tenths of microns.

In accordance with the present invention, the high performance MOS transistor devices are more readily formed during an exposure step as a result of the substantially planar (i.e., having a substantially planar topology) upper level polysilicon substrate 18, formed over the low-K dielectric layer 14 and the bulk substrate 10. As mentioned above, a depth of focus is important with respect to the fabrication of small geometries and a planar formation. The substantially planar upper level substrate advantageously enables an exposure over the entire upper level substrate to be made within a given depth of focus during fabrication of the high performance MOSFETs. It may be necessary to perform two exposures as a result of the differences in height between the upper level substrate 18 and the bulk silicon substrate 10. The latter may be necessary if it is desired to have small feature sizes in both the upper level substrate and the bulk substrate.

In an alternate embodiment, a planar high performance MOS transistor formation may also occur higher up in a structure of layers above a bulk substrate. That is, a base layer which is or has been planarized can have a low-K dielectric layer deposited thereon. The low-K dielectric layer would be essentially planar, since the underlying layer has been planarized. The formation of the low-K dielectric layer is followed by the deposition of a polysilicon layer, the polysilicon layer being intended for use as an upper level substrate for the formation of high performance MOS transistor devices.

The present transistor formation and substrate thus utilizes a planar low-K dielectric. The low-K dielectric preferably includes a material having a dielectric constant K value in the range of 2.5 to 3.5, as opposed to typical oxide which has a K value close to 4.2. The low-K dielectric layer for use in accordance with the present invention thus excludes a typical oxide. As previously discussed, examples of low-K dielectric materials include, fluorine based dielectric materials. Alternatively, spin-on-glass may also be used for the low-K dielectric. The low-K dielectric layer can be formed upon the bulk silicon substrate using any suitable known technique.

The present invention thus provides for the fabrication of small geometry high performance MOS transistor devices in an upper level polysilicon substrate 18 deposited upon the planar low-K dielectric layer 12. The range of geometries for high performance MOS transistor devices includes 0.1 to 0.2 microns, with respect to a minimum feature size, such as the high performance transistor gate length. The gate length always represents a minimum speed delay in a transistor from the source to the drain. In addition, the gate length, as used herein, is defined by a length of the gate electrode between a source region and a drain region. Referring still to FIG. 6, subsequent to gate conductor 32 formations, well regions 34 are defined in the upper level polysilicon substrate 18 deposited upon the low-K dielectric layer 12. Additional process steps are then carried out for the formation of lightly doped drains 36, sidewall spacers 38, source/drain regions 40/42, and desired ion implants of the high performance transistor devices 44 in the upper level polysilicon substrate 18 above the low-K dielectric layer 12 upon the bulk substrate 10. For instance, high performance transistor devices 44 can be formed using techniques described in copending applications Ser. No. 08/743,643, entitled "HIGH PERFORMANCE MOSFET STRUCTURE HAVING ASYMMETRICAL SPACER FORMATION AND METHOD OF MAKING THE SAME" filed Nov. 4, 1996; Ser. No. 08/791,378, entitled "METHOD OF FORMING A MULTIPLE TRANSISTOR CHANNEL DOPING USING A DUAL RESIST FABRICATION SEQUENCE" filed Jan. 30, 1997; and Ser. No. 08/798,639 entitled "A METHOD OF INTEGRATING LDD IMPLANTATION FOR CMOS DEVICE FABRICATION" filed Feb. 11, 1997, all assigned to the assignee of the present invention. In addition, transistor devices 46 are formed in bulk substrate 10, which may also include high performance or other transistor devices as may be desired for a particular integrated circuit application.

In the fabrication of a structure in accordance with the present invention, a low-K dielectric is deposited upon a bulk structure, wherein the low-K dielectric layer is either planar as formed or planarized if necessary. A polysilicon upper level substrate layer is then deposited upon the planar low-K dielectric layer. Subsequently, high performance MOS transistor devices are formed upon the upper level polysilicon substrate layer. The low-K dielectric layer provides a reduced capacitive effect between the underlying bulk substrate and the upper level substrate devices, thus ensuring a maximum device speed of the high performance transistor devices in the upper level substrate. The present invention further includes the formation of bulk silicon transistor devices, in addition to formation of high performance MOS transistor devices, or portions of the high performance MOS transistor devices, in a same process flow or with simultaneous process steps. This is another key feature of the present invention.

Figure 2:
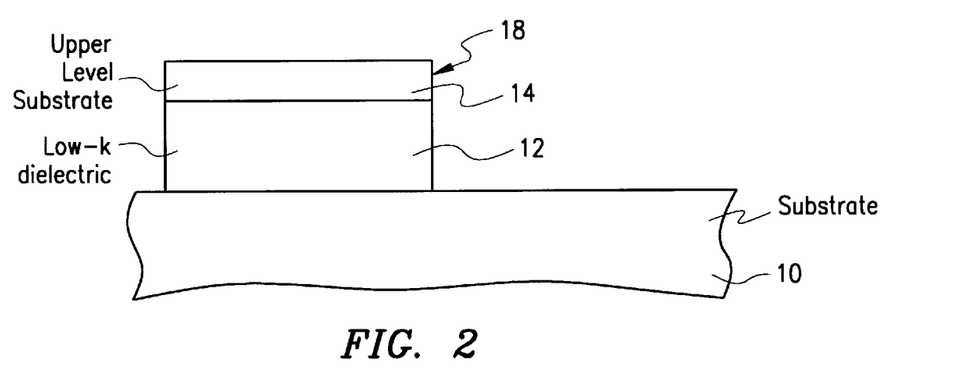
Figure 3:
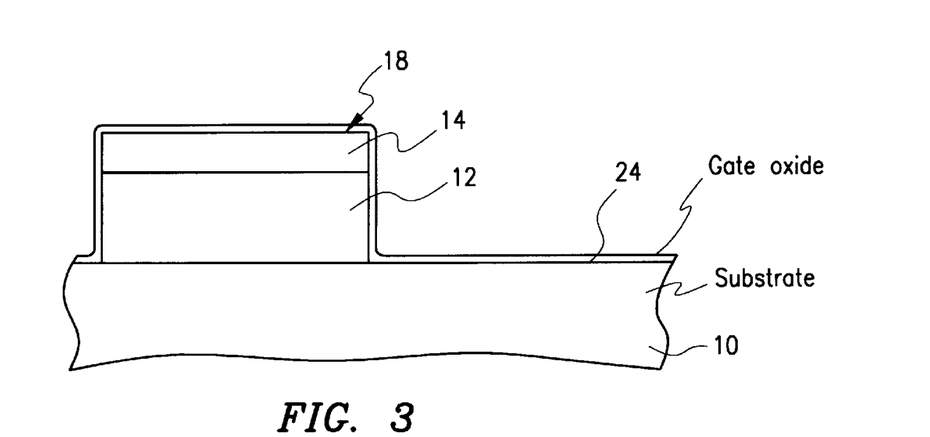
Figure 7:
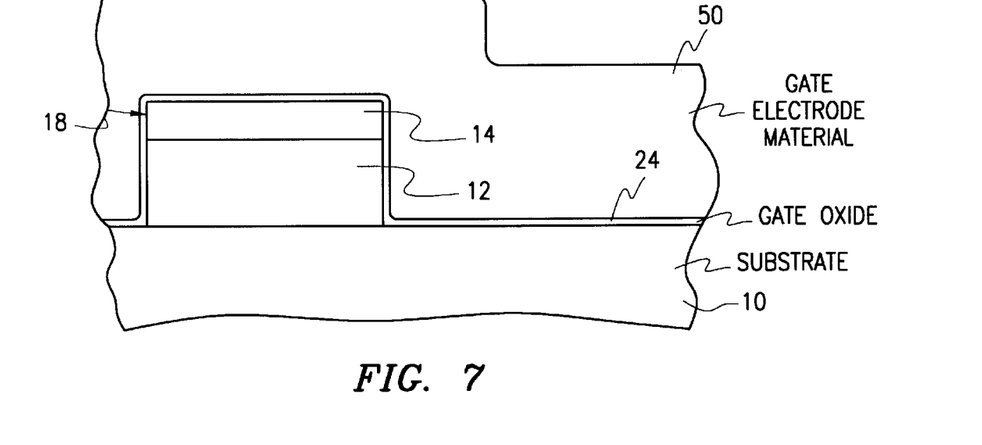
FIGS. 7–10 illustrate an alternate embodiment of the process flow steps according to the present invention.

Turning now to FIGS. 7–11, the substrate structure according to an alternate embodiment of the present invention shall be discussed. Subsequent to formation of the low-K dielectric 12, polysilicon layer 14 (having been patterned into a desired upper level polysilicon substrate region as shown in FIG. 2), and gate oxide 24 as previously discussed with respect to FIGS. 1–3, a gate electrode material 50 is conformally deposited thereon as shown in FIG. 7. Gate electrode material 50 may include any suitable metal or polysilicon. Exemplary metals may include Al, W, Ti and Co. Polysilicon may include doped N+ or P+ doped polysilicon, depending upon a particular desired transistor formation.

Figure 8:
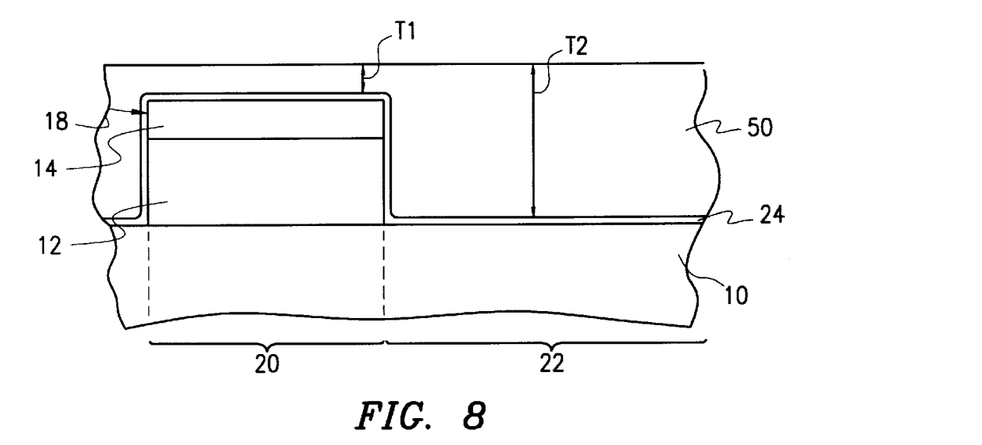
Figure 9:
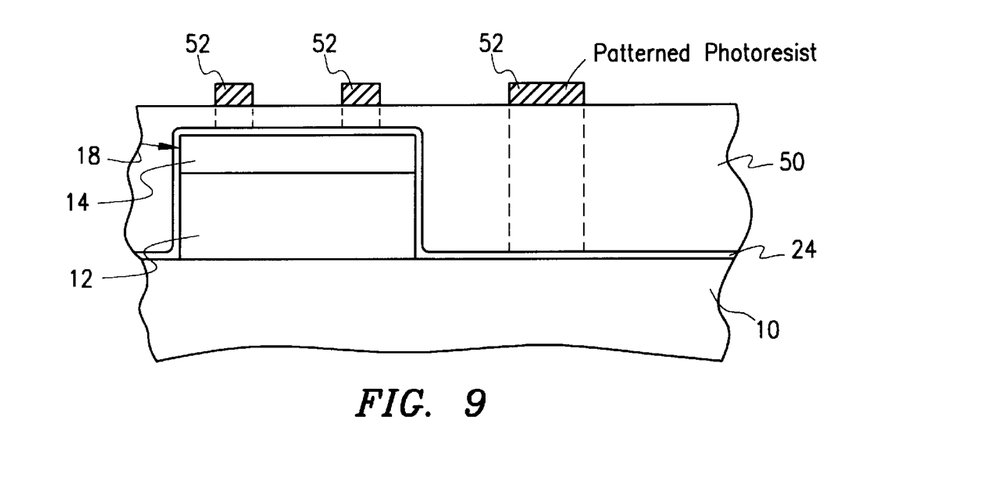

Referring now to FIG. 8, the gate electrode material 50 of FIG. 7 is polished back or planarized using any suitable planarization technique to obtain a desired thickness over the low-K dielectric material in Region 1 (20). In the instance of polysilicon for the gate electrode material 50, for example, the polysilicon is thicker on the right hand portion Region 2 (22) of FIG. 8, in comparison to the left hand portion in Region 1 (20). As a result, transistor device structures can be made which have slightly different polysilicon gate electrode layer thicknesses which would be advantageous, for example, for ion implant penetration considerations such as with respect to boron penetration. Thus another embodiment of the present invention is provided.

With further reference to the embodiment of FIGS. 7–11, the present invention includes polysilicon (poly2) 50 formed upon the gate oxide 24 and the first polysilicon (poly1) 14 which is deposited upon the low-K dielectric material layer 12 and which forms upper level substrate 18. Gate oxide 24 is deposited upon the first polysilicon 14, further having a gate oxide thickness in the range of 10–40 Å (Angstroms). After planarization, the second polysilicon 50 can have a thickness T1 in the range on the order of 500–1,000 Å on the left-hand side corresponding to Region 1 (20), and a thickness T2, in the range on the order of 2,000 to 4,000 Å on the right-hand side corresponding to Region 2 (22).

Figure 10:
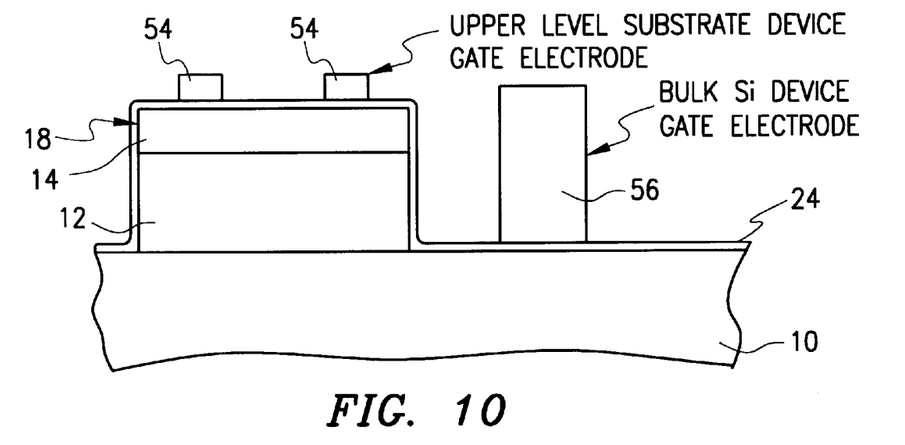
Figure 11:
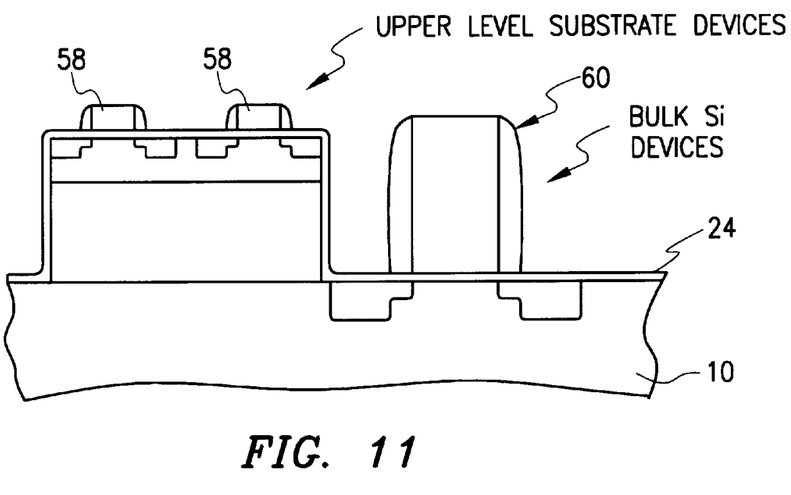
FIGS. 11–16 illustrate yet another alternate embodiment of the process flow steps according to the present invention.

Further, in accordance with the alternate embodiment, a photoresist 52 is deposited and patterned as necessary (FIG. 9) for formation of upper level substrate gate electrodes 54 and bulk substrate gate electrode 56 as shown in FIG. 10. The poly2 layer 50 of FIG. 9 can advantageously be patterned for formation of transistor devices in both the bulk silicon region and in the upper level polysilicon substrate 18 above the low-K dielectric layer 12. High performance MOSFET transistor devices 58 can then be formed in the upper level substrate 18 as discussed herein above with respect to FIG. 6. A bulk silicon transistor device 60 may also be formed in bulk substrate 10. An advantage of the present invention is that low-K dielectric isolated transistor devices can be formed. The low-K dielectric isolated upper level substrate transistor devices have unique features including minimum leakage current, in addition to other device performance enhancements obtained from this type of structure, for example, as may be used in memory regions of a memory cell. In addition, the upper level substrate transistor structures provide for low power consumption.

As the polysilicon of the upper level substrate is scaled very thin, there is a fundamental limitation on how thin one can make the polysilicon layer without suffering undesired boron penetration during an implant of $BF_2$. By having a thicker polysilicon layer, the problem of any undesired boron penetration is solved. The transistor devices in the bulk region can be PMOS transistors, for example. The upper level substrate devices can be high performance NMOS transistor devices. $BF_2$ is a species of boron and a P-type dopant.

Another advantage of the present invention is that by using the process technique described herein, smaller oxide sidewall spacers are able to be formed in the high performance transistor upper level polysilicon substrate region of the overall structure. Formation of smaller sidewall spacers is driven due to the thickness of the gate conductor 54 when performing a sidewall spacer etch step. The present invention can thus be used for making an integrated circuit having various scaled size transistor devices all on the same substrate. That is, high performance MOS transistor devices 58 can be formed upon an upper level polysilicon substrate 18 and larger scale MOS transistor devices 60 (only one shown) can be formed in the bulk substrate 10. Basically, the present invention can be used to make a more scaled transistor in certain parts of an overall integrated circuit, as may be desired for a particular integrated circuit application.

As discussed above, the gate electrode material 50 or second polysilicon layer is deposited, planarized, and then etched according to a pattern for forming desired circuit features. The thickness of the second polysilicon 50 in the region of the first polysilicon 14 is scaled to a much smaller dimension than in the region outside Region 1 (20). As a result, smaller dimensioned sidewall spacers are obtained in the region of the upper level substrate, which enables fabrication of smaller dimension MOSFET devices 58 in the upper level substrate region 20. Thus, there is provided a better control of the formation of high performance MOS transistor devices 58 in desired upper level substrate regions of an integrated circuit structure. Sidewall spacers in other regions of the integrated circuit structure are similar to conventional sidewall spacers, for example, having similar dimensions for sidewall spacers of bulk transistor devices 60 (only one shown) of FIG. 11.

In regions of the integrated circuit structure over the bulk silicon, bulk MOS transistor devices 60 (only one shown) are formed as required for a particular integrated circuit application. In the upper level polysilicon substrate 18 formed upon the low-K dielectric, high performance MOS transistor devices 58 are formed. A suitable gate oxide for the high performance MOS transistor devices is formed upon the upper level polysilicon substrate, upon which is formed corresponding gate electrodes or conductors (e.g., a second patterned and etched polysilicon).

The low-K dielectric layer 12 enables improved device performance, lower current leakage, lower power consumption, and lower capacitance (a key feature) between the upper level polysilicon substrate 18 and the underlying bulk silicon substrate 10. Lower capacitance provides for improved and increased high performance MOS transistor device speeds.

The speed of the high performance MOS transistors formed in the upper level polysilicon substrate portion of the overall integrated circuit will be advantageously increased due to a decreased capacitance between the upper level polysilicon substrate and the bulk silicon substrate. In addition, a high performance MOS transistor formation in the upper level polysilicon substrate according to the present invention also yields a better transistor in that the underlying low-K dielectric further improves the transistor.

With respect to the alternate process flow according to the present invention as illustrated in FIGS. 7–11, various gate electrode geometries can be achieved. For example, it is possible to obtain a thicker gate electrode on the bulk silicon portion of the overall integrated circuit, compared with the gate electrode thickness in the upper level polysilicon substrate region.

In the alternate embodiment as discussed above, a second polysilicon layer is used for formation of gate electrodes. The second polysilicon layer is formed over the upper level polysilicon substrate region and over the bulk region to have an initial thickness on the same order of magnitude in both regions. In other words, the second polysilicon layer is deposited over the first and second regions, 20 and 22, respectively. In the alternate embodiment, the second polysilicon layer is then planarized such that the thickness of the second polysilicon layer over the bulk silicon region is on an order of magnitude larger than the second polysilicon layer thickness in the upper level substrate region. The latter step of planarizing the second polysilicon layer enables the formation of different size devices in the respective regions as a result. In the region of the upper level polysilicon substrate, gate electrodes are of a much smaller magnitude compared with gate electrodes formed over the bulk silicon not covered by the low-K dielectric material.

Figure 12:
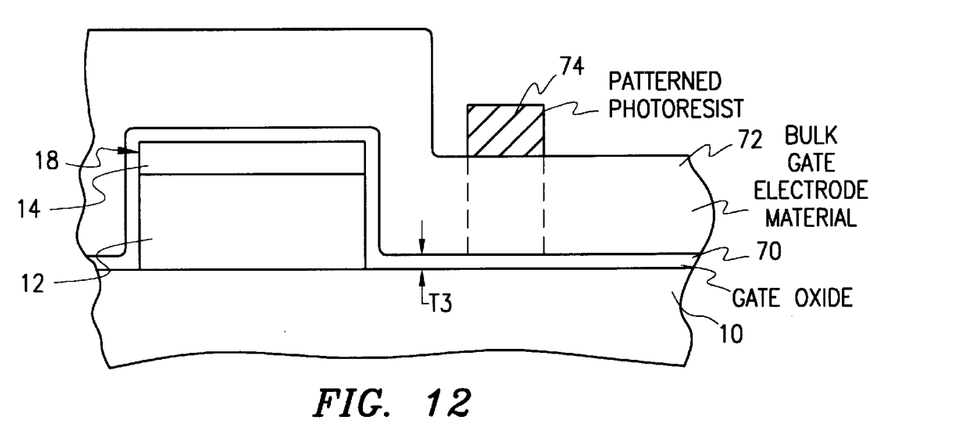
Figure 13:
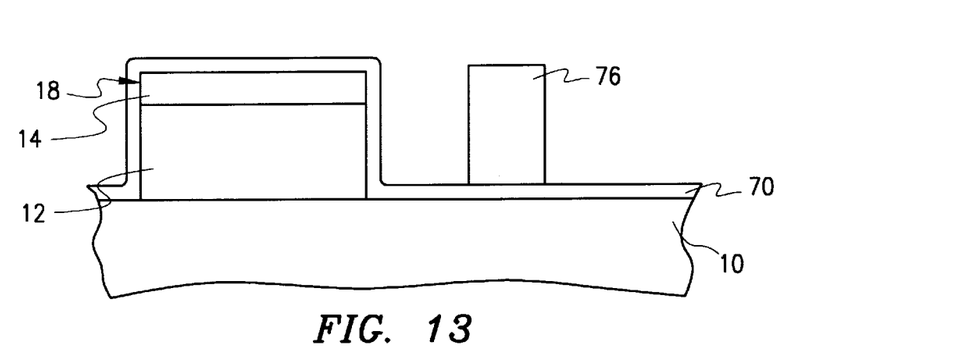
Figure 14:
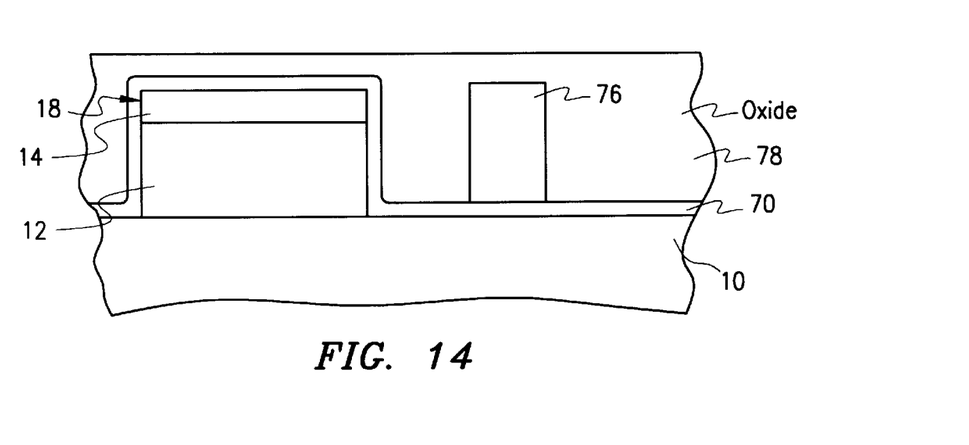
Figure 15:
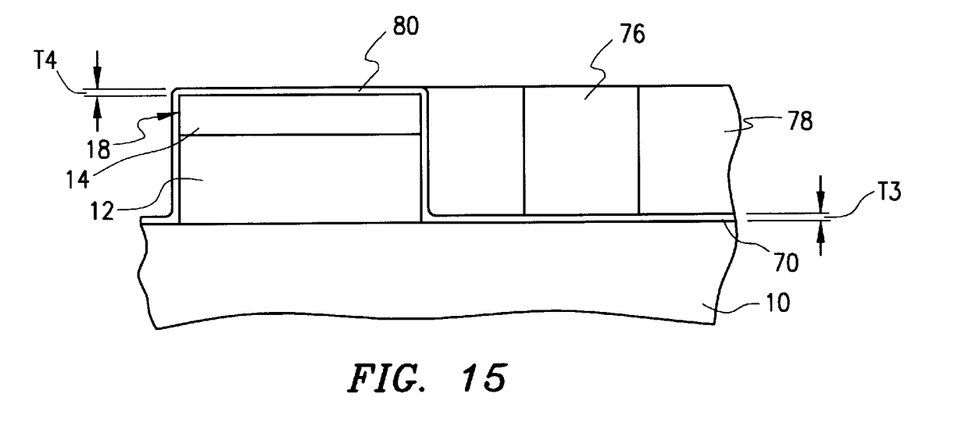
Figure 16:
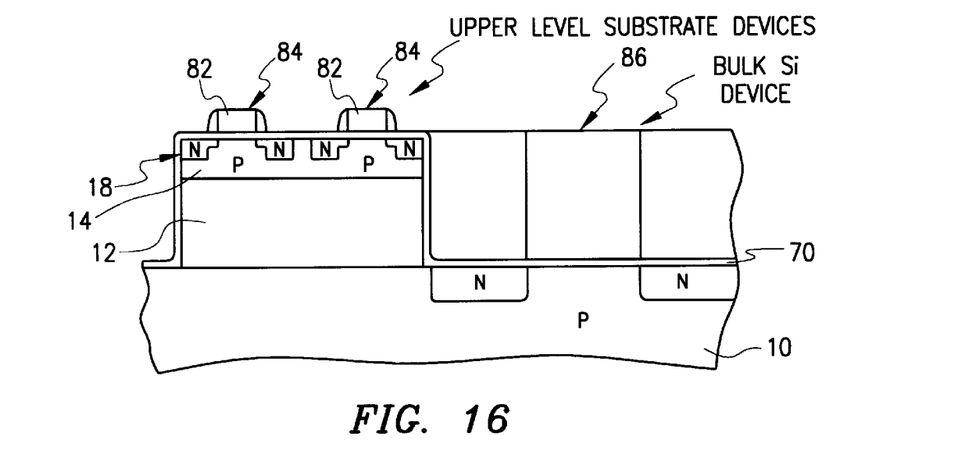

Referring now to FIGS. 12–16, another alternate embodiment according to the present invention shall be described. As shown in FIG. 12 subsequent to formation of upper level substrate 18 as shown in FIG. 2, an oxide layer 70 having a thickness T3 suitable for formation of desired bulk silicon transistor devices is formed over the upper level substrate 18 and the bulk silicon 10. Next, a gate electrode material 72 is deposited over oxide layer 70. A suitable photoresist 74 is deposited and patterned as necessary for formation of bulk substrate gate electrodes 76 (only one shown) as shown in FIG. 13. After formation of gate electrode 76, a second oxide layer 78 is formed over the upper level substrate 18 and the bulk silicon region, as shown in FIG. 14. The oxide layer 78 is then planarized using any suitable planarization technique such that the oxide thickness above the upper level substrate 18 has a desired gate oxide thickness T4, where thickness T4 is less than thickness T3, as shown in FIG. 15. Thus the gate oxide 80 of the upper level substrate 18 is of a different thickness than the gate oxide 70 over the bulk substrate 10.

Subsequent to the gate oxide 80 formation over upper level substrate 18, gate electrodes 82 are formed with respect to desired upper level substrate high performance MOSFET transistor devices 84. Furthermore, high performance MOSFET transistor devices 84 and bulk silicon transistor devices 86 (only one shown) can then be completed as discussed herein above similarly as with respect to the embodiments shown in FIGS. 6 and 11 as required for a particular integrated circuit application.

A key feature of the embodiment shown with respect to FIGS. 12–16 is an ability to have different gate oxide thicknesses on the same structure. Depending upon a control of polishing thicknesses, two gate oxidations may be required. For the gate oxide on the upper level substrate, it is preferable to polish back and to ensure that a desired control on the thickness of the gate oxide over the upper level substrate is maintained. Alternatively, a first thickness of oxide can be used to define gate oxide 70 and when polished back, it can be removed from above the polysilicon 14 of upper level substrate 18. Subsequently, a second oxide may be formed over the upper level substrate for use as the gate oxide of high performance MOSFET transistor devices formed in the upper level substrate. The gate oxides may be deposited or grown, preferably deposited. Still further, a polish back of oxide 70 to just before polysilicon 14 can be done, thus the remaining oxide above polysilicon 14 can be used for the upper level substrate gate oxide 80. As discussed herein, the gate oxides can have equal thickness or different thicknesses between the upper level substrate devices and the bulk silicon devices.

The present invention thus provides various transistor structures formed on a substrate. Each structure includes a low-K dielectric layer and an upper level polysilicon substrate formed in a desired upper level substrate region. The structure further includes a gate oxide and formation of transistor devices in both regions of the low-K dielectric and the bulk substrate. In addition, transistors in the low-K dielectric region can have a first gate oxide thickness, whereas transistors formed in the region of the bulk substrate outside the low-k dielectric region can have a second gate oxide thicknesses. In one embodiment, the gate oxide thickness are the same. Alternatively, the gate oxide thicknesses are different.

The present invention further includes a method in which, in a first embodiment, utilizes a polysilicon polish and in a second embodiment, utilizes an oxide polish. In the embodiment which includes the polysilicon polish, gate electrodes for the high performance transistor structures of the upper level substrate in the low-K dielectric region are defined by a height dimension of the polysilicon in the regions of the bulk silicon.

As discussed herein, the low-K dielectric of the structure according to the present invention, is deposited and not a grown dielectric layer. According to the present invention, a polysilicon layer is preferably used as an upper level substrate, in comparison with the bulk substrate. The present invention thus provides for formation of high performance transistor devices in an upper level substrate, the upper level substrate being separated from an underlying bulk substrate by a low-K dielectric layer.

In the present invention, the polysilicon layer above the low-K dielectric is used as substrate, and a substrate definition is maintained therein. That is, source and drain regions are not diffused fully through the polysilicon layer making up the upper level substrate, in which the polysilicon layer can still be defined (i.e., considered) a substrate. In the present invention, the source and drain regions of devices formed in the upper level polysilicon layer above the low-K dielectric do not fully extend through (i.e., not completely diffusing through) the polysilicon layer. Control of the upper level substrate is maintained, as necessary for the formation of high performance MOSFET transistor devices in the polysilicon layer overlying the low-K dielectric layer. The present invention also implements planar high performance MOS transistor devices in the upper level substrate.

Stated differently, the source/drain regions of transistor devices do not entirely consume the upper level substrate. Some dopant (beneath the transistor devices) of the opposite type remains in the upper level substrate. As long as some dopant remains underneath the source/drain regions, a substrate definition is maintained. In a situation in which a substrate is diffused all the way through, then the resulting structure is purely a transistor without a substrate (i.e., no substrate definition remains). In the present invention, the fact is that the upper level substrate, after device formation, still maintains a substrate definition of an opposite conductivity type therein. For example, for N+ source/drain implants, the substrate definition would include p-type.

When processing desired transistor formations in the upper level substrate, for example, using three implants, processing can be done to the upper layer substrate to include well formations, punch-through regions, and Vt implants. Transistor formations in the upper level substrate can be accomplished using the methods, such as, disclosed in US applications mentioned herein above.

While the invention has been particularly shown and described with reference to specific embodiments thereof, it will be understood by those skilled in the art that various changes in form and detail may be made thereto, and that other embodiments of the present invention beyond embodiments specifically described herein may be made or practiced without departing from the spirit and scope of the present invention as limited solely by the appended claims.

What is claimed is:

1. A method of making a high performance semiconductor device structure comprising the steps of:
   providing a bulk semiconductor substrate;
   providing an upper level silicon substrate having a thickness of less than 1,000 Å, the upper level silicon substrate including a low-K dielectric layer formed on the bulk semiconductor substrate and a silicon substrate layer formed upon the low-K dielectric layer, the silicon substrate layer and low-K dielectric layer being patterned into the upper level substrate in a first region and the bulk semiconductor substrate being exposed in a second region, the low-K dielectric layer having a dielectric K-value in the range of 2.0–3.8;
   forming a gate oxide layer over the upper level substrate in the first region and over the exposed bulk semiconductor substrate in the second region; and
   forming transistor device formations in the upper level substrate and in the bulk semiconductor substrate such that the upper level silicon substrate definition is maintained.

2. The method of claim 1, wherein
the low-K dielectric layer includes a low-K dielectric material selected from the group consisting of a deposition type material having a fluorine component and a spin-on type material having a fluorine component.

3. The method of claim 1, wherein
the low-K dielectric layer includes a low-K fluorine incorporated dielectric material selected from the group consisting of fluorosilicate glass (FSG), silicon oxyfluoride (FxSiOy), hydrogen silsesquioxane, fluorinated polysilicon, poly-phenylquinoxaline, polyquinoline, methysilsesquixane polymer, and fluoro-polymide.

4. The method of claim 1, wherein
the low-K dielectric layer includes a low-K dielectric material formed by a deposition from a fluorine containing ambient such that a fluorine concentration in the range of 3–20 atom percent is achieved.

5. The method of claim 1, wherein
the gate oxide layer includes a first gate oxide thickness over the upper level substrate in the first region and a second gate oxide thickness over the exposed bulk semiconductor substrate in the second region, further wherein the first gate oxide thickness and the second gate oxide thickness are equal.

6. The method of claim 1, wherein
the gate oxide layer includes a first gate oxide thickness over the upper level substrate in the first region and a second gate oxide thickness over the exposed bulk semiconductor substrate in the second region, further wherein the first gate oxide thickness and the second gate oxide thickness are not equal.

7. The method of claim 6, further wherein the first gate oxide thickness is smaller than the second gate oxide thickness.

8. The method of claim 1, wherein
the transistor device formations include transistor device formations in the upper level substrate having gate electrodes of a first thickness and transistor device formations in the bulk semiconductor substrate having gate electrodes of a second thickness, further wherein the first gate electrode thickness and the second gate electrode thickness are equal.

9. The method of claim 1, wherein
the transistor device formations include transistor device formations in the upper level substrate having gate electrodes of a first thickness and transistor device formations in the bulk semiconductor substrate having gate electrodes of a second thickness, further wherein the first gate electrode thickness and the second gate electrode thickness are not equal.

10. The method of claim 9, further wherein the first gate electrode thickness is smaller than the second gate electrode thickness.

11. A high performance semiconductor device structure comprising:

a bulk semiconductor substrate;

an upper level silicon substrate, said upper level silicon substrate having a thickness of less than 1,000 Å and, including a low-K dielectric layer formed on said bulk semiconductor substrate and a silicon substrate layer formed upon the low-K dielectric layer, the silicon substrate layer and low-K dielectric layer being patterned into said upper level substrate in a first region and the bulk semiconductor substrate being exposed in a second region, the low-K dielectric layer having a dielectric K-value in the range of 2.0–3.8;

a gate oxide layer formed over said upper level substrate in the first region and over the exposed bulk semiconductor substrate in the second region; and transistor device formations in the upper level substrate and in the bulk semiconductor substrate such that the upper level silicon substrate definition is maintained.

12. The high performance semiconductor device structure of claim 11, wherein said low-K dielectric layer includes a low-K dielectric material selected from the group consisting of a deposition type material having a fluorine component and a spin-on type material having a fluorine component.

13. The high performance semiconductor device structure of claim 11, wherein said low-K dielectric layer includes a low-K fluorine incorporated dielectric material selected from the group consisting of fluorosilicate glass (FSG), silicon oxyfluoride (FxSiOy), hydrogen silsesquioxane, fluorinated polysilicon, poly-phenylquinoxaline, polyquinoline, methysilsesquixane polymer, and fluoro-polymide.

14. The high performance semiconductor device structure of claim 11, wherein said low-K dielectric layer includes a low-K dielectric material formed by a deposition from a fluorine containing ambient with a fluorine concentration in the range of 3–20 atom percent.

15. The high performance semiconductor device structure of claim 11, wherein said gate oxide layer includes a first gate oxide thickness over the upper level substrate in the first region and a second gate oxide thickness over the exposed bulk semiconductor substrate in the second region, further wherein the first gate oxide thickness and the second gate oxide thickness are equal.

16. The high performance semiconductor device structure of claim 11, wherein said gate oxide layer includes a first gate oxide thickness over the upper level substrate in the first region and a second gate oxide thickness over the exposed bulk semiconductor substrate in the second region, further wherein the first gate oxide thickness and the second gate oxide thickness are not equal.

17. The high performance semiconductor device structure of claim 16, further wherein the first gate oxide thickness is smaller than the second gate oxide thickness.

18. The high performance semiconductor device structure of claim 11, wherein said transistor device formations include transistor device formations in the upper level substrate having gate electrodes of a first thickness and transistor device formations in the bulk semiconductor substrate having gate electrodes of a second thickness, further wherein the first gate electrode thickness and the second gate electrode thickness are equal.

19. The high performance semiconductor device structure of claim 11, wherein said transistor device formations include transistor device formations in the upper level substrate having gate electrodes of a first thickness and transistor device formations in the bulk semiconductor substrate having gate electrodes of a second thickness, further wherein the first gate electrode thickness and the second gate electrode thickness are not equal.

20. The high performance semiconductor device structure of claim 19, further wherein the first gate electrode thickness is smaller than the second gate electrode thickness.

* * * * *